US006784378B2

(12) United States Patent
Zhu et al.

(10) Patent No.: US 6,784,378 B2
(45) Date of Patent: Aug. 31, 2004

(54) COMPLIANT OFF-CHIP INTERCONNECTS

(75) Inventors: Qi Zhu, Atlanta, GA (US); Lunya Ma, Atlanta, GA (US); Suresh K. Sitaraman, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/083,782

(22) Filed: Feb. 25, 2002

(65) Prior Publication Data

US 2002/0118515 A1 Aug. 29, 2002

Related U.S. Application Data

(60) Provisional application No. 60/271,662, filed on Feb. 28, 2001.

(51) Int. Cl.[7] .............................. H01R 12/04; H05K 1/11
(52) U.S. Cl. ..................... 174/267; 174/260; 174/261; 361/760; 361/776; 257/778; 439/66
(58) Field of Search ........................ 174/267, 260, 174/261, 250; 361/760, 803, 773, 774, 776; 257/696, 778, 780; 439/66

(56) References Cited

U.S. PATENT DOCUMENTS

| | | | | |
|---|---|---|---|---|
| 4,615,573 A | * | 10/1986 | White et al. ............... 439/66 |
| 5,607,818 A | | 3/1997 | Akram et al. ............. 430/311 |
| 5,625,298 A | | 4/1997 | Hirano et al. ............. 324/754 |
| 5,689,317 A | | 11/1997 | Miller ........................ 349/97 |
| 5,716,218 A | | 2/1998 | Farnsworth et al. ......... 438/15 |
| 5,763,941 A | * | 6/1998 | Fjelstad ..................... 257/669 |
| 5,869,974 A | | 2/1999 | Akram et al. .............. 324/754 |
| 5,893,727 A | | 4/1999 | Lau et al. ................... 438/125 |
| 6,063,648 A | * | 5/2000 | Beroz et al. ............... 438/113 |
| 6,068,669 A | | 5/2000 | Farnsworth et al. ....... 29/25.01 |
| 6,399,900 B1 | * | 6/2002 | Khoury et al. ............. 174/267 |

OTHER PUBLICATIONS

Qi Zhu, Lunyu Ma, and Suresh K. Sitaraman; Mechanical and Preliminary Electrical Design of a Novel Compliant One–Turn Helix (OTH) Interconnect; Jul. 8–13, 2001; pp. 1–6.

Lunyu Ma, Qi Zhu, and Suresh Sitaraman; Alternative Compliant Interconnects—Thermo–Mechanical Reliability, Design and Testing; Nov. 11–16, 2001; pp. 1–10.

* cited by examiner

Primary Examiner—Evan Pert
Assistant Examiner—I B Patel

(57) ABSTRACT

Electronic packages having compliant off-chip interconnects and methods of fabricating compliant off-chip interconnects are disclosed. A representative electronic package includes a substrate and a free-standing compliant off-chip interconnect. The free-standing compliant off-chip interconnect includes a first free-standing arcuate structure that is substantially parallel to the substrate. In addition, the method of fabricating free-standing arcuate structure compliant off-chip interconnects includes: depositing an arcuate structure compliant off-chip interconnect material; and forming the free-standing arcuate structure compliant off-chip interconnect.

19 Claims, 14 Drawing Sheets

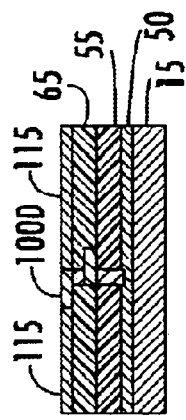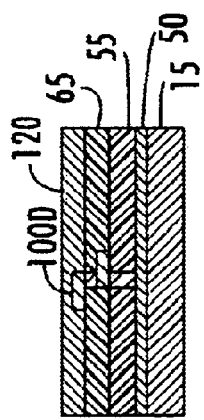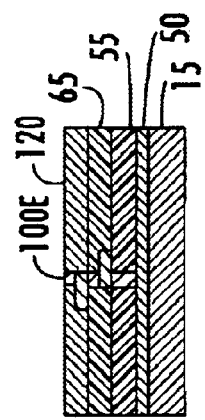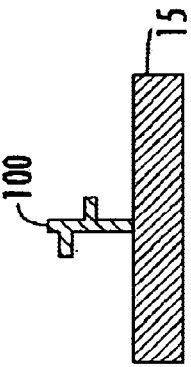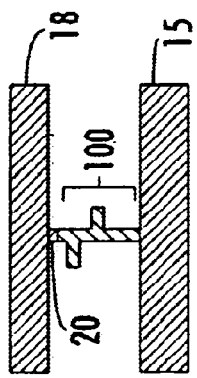
FIG. 4F  FIG. 4G  FIG. 4H  FIG. 4I  FIG. 4J
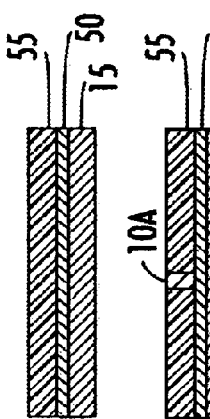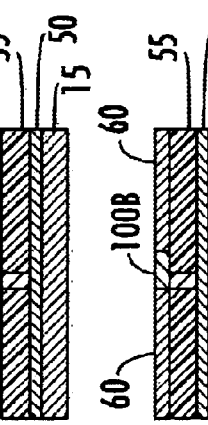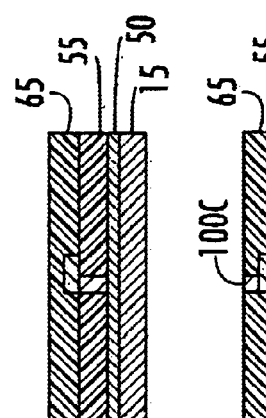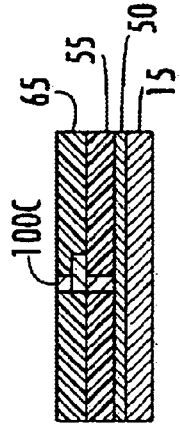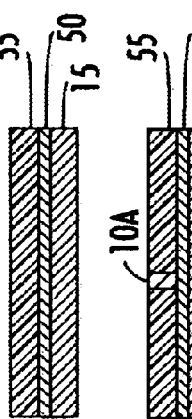
FIG. 4A  FIG. 4B  FIG. 4C  FIG. 4D  FIG. 4E

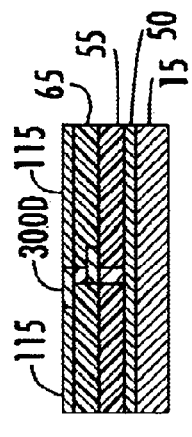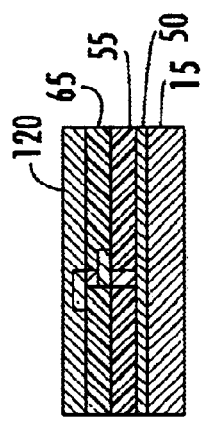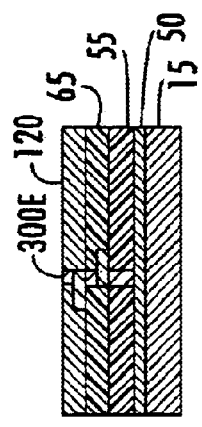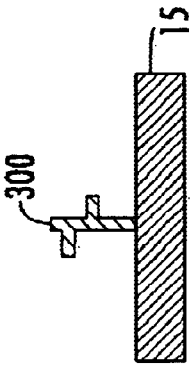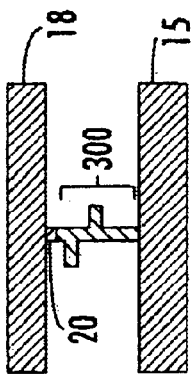
FIG. 7F  FIG. 7G  FIG. 7H  FIG. 7I  FIG. 7J
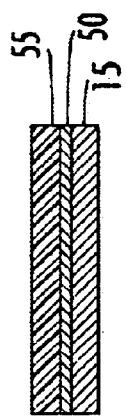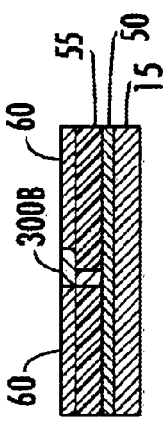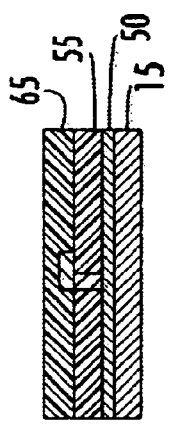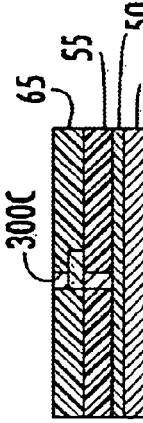
FIG. 7A  FIG. 7B  FIG. 7C  FIG. 7D  FIG. 7E

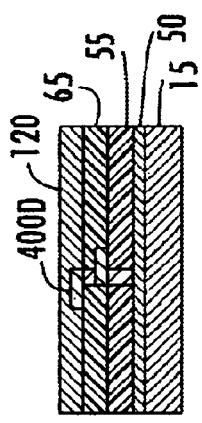
FIG. 9F
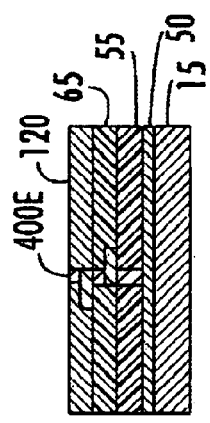
FIG. 9G
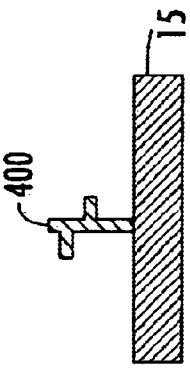
FIG. 9H
FIG. 9I
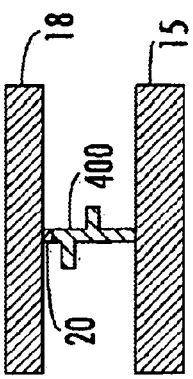
FIG. 9J
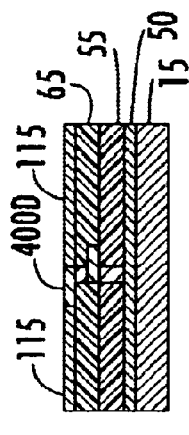
FIG. 9A
FIG. 9B
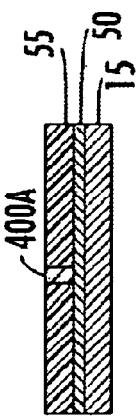
FIG. 9C
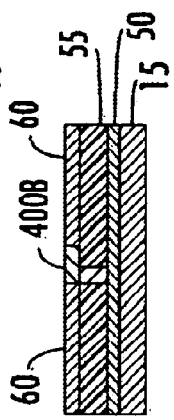
FIG. 9D
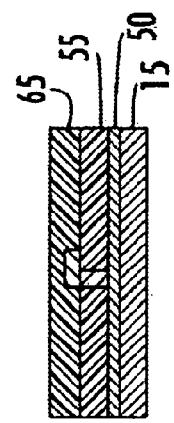
FIG. 9E

COMPLIANT OFF-CHIP INTERCONNECTS

CROSS-REFERENCE TO RELATED APPLICATION

This application claims priority to U.S. provisional application entitled, "Lithography based compliant coil off-chip interconnect in electronic packaging," having Ser. No. 60/271,662, filed 02/28/2001, which is entirely incorporated herein by reference.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of MDA972-99-1-0002 awarded by the DARPA of the U.S. government.

TECHNICAL FIELD

The present invention is generally related to off-chip interconnects and, more particularly, is related to compliant off-chip interconnects.

BACKGROUND

The miniaturization of devices, high input/output (I/O) density, fast clock speed, good functionality and system integrity, low cost, and good reliability have driven advancements in the electronic industry. The rapid advances in integrated circuit (IC) design and fabrication continue to challenge and push electronic packaging technology, in terms of size, performance, cost, and reliability. The minimum feature size in IC components will reach the scale of about 40 nanometers by 2001 according to International Technology Roadmap for Semiconductors (ITRS) 200 Update; requiring chip-to-substrate interconnect pitch in the range of few microns. There are no cost-effective and manufacturable chip-to-substrate interconnections that have such a fine pitch, and also able to accommodate the coefficient of thermal expansion (CTE) mismatch among different components without sacrificing reliability and performance. This has become a problem that will continue to limit the advances in the electronic industry.

Flip chips with solder bumps are being increasingly used in the electronic packaging industry, such packaging facilitates smaller chip size, higher I/O count, and shorter connection paths. Because of the larger CTE difference between the chip and substrate, underfill material is often added to reduce the significant shear strains in the solder bumps. Although underfill can greatly improve the flip chip interconnect reliability, there are still some challenges, such as the cost associated with dispensing the underfill as well as the time to cure the underfill. It should be noted that as the pitch size between solder bumps is reduced in the next-generation packaging, the height of solder bumps, and thus the gap also is reduced. Thus, the difficulty of underfill dispensing increases. Also, with reduced pitch, the reliability of the solder bumps is compromised.

Accommodation of CTE mismatch without underfill, fine pitch, high reliability, ease of fabrication, and low-cost are some of the challenges for next-generation interconnects from a thermo-mechanical perspective.

Thus, a heretofore unaddressed need exists in the industry to address the aforementioned deficiencies and/or inadequacies.

SUMMARY OF THE INVENTION

Briefly described, the present invention provides for electronic packages having new types of compliant off-chip interconnects. A representative electronic package includes a substrate and a free-standing compliant off-chip interconnect. The freestanding compliant off-chip interconnect includes a first free-standing arcuate structure that is substantially parallel to the substrate.

The present invention also provides methods for fabricating free-standing arcuate structure compliant off-chip interconnects. A representative method in accordance with the present invention includes the following steps: depositing an arcuate structure compliant off-chip interconnect material; and forming the free-standing arcuate structure compliant off-chip interconnect.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 4A–4J are schematics of a representative process for fabricating the asymmetrical double arcuate structure compliant off-chip interconnect shown in FIGS. 3A–3D.

FIGS. 7A–7J are schematics of a representative process for fabricating the double arcuate structure compliant off-chip interconnect shown in FIGS. 6A–6D.

FIGS. 9A–9J are schematics of a representative process for fabricating the double arcuate structure compliant off-chip interconnect shown in FIGS. 8A–8D.

DETAILED DESCRIPTION

Figure 1A:
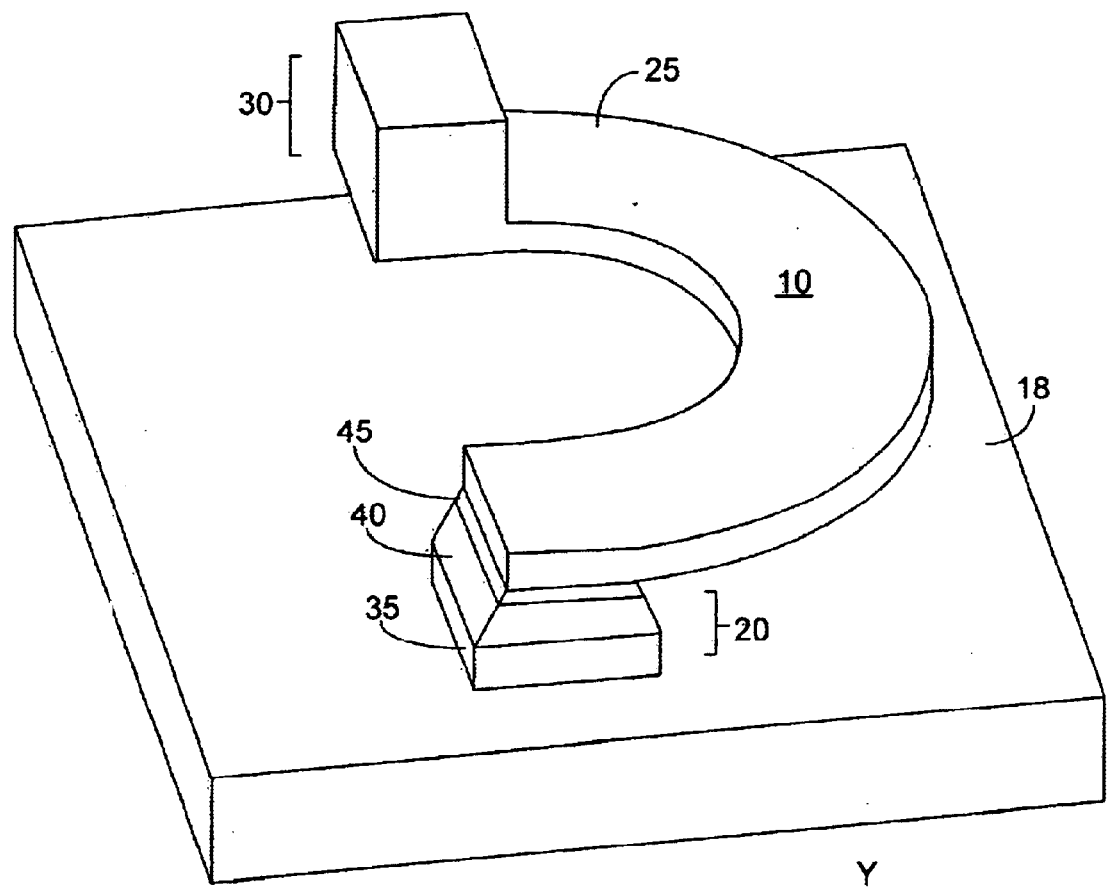
FIG. 1A illustrates a perspective view of a single arcuate structure compliant off-chip interconnect.

In general, the free-standing arcuate structure compliant off-chip interconnects of the present invention include one or more arcuate structures. The arcuate structures are connected to a substrate and are substantially parallel to the substrate (e.g., fabrication and/or assembly substrate). Typically, the arcuate structures have a thickness of about 3 to about 30 micrometers, a width of about 5 to about 50 micrometers, and a mean radius of about 5 to about 100 micrometers. When the compliant free-standing off-chip interconnect includes two or more arcuate structures, the arcuate structures are substantially parallel to one another. The arcuate structures can be connected to one another using posts and/or bridge structures. The arcuate structures, ports, and bridge structures can have various shapes such as rectangular, square, or circular, for example.

The free-standing arcuate structure compliant off-chip interconnects of the present invention potentially exhibit multi-directional compliance to accommodate probing and/or assembly forces as well as the mismatch of materials having different coefficients of thermal expansion. The design shape and dimensions of the free-standing arcuate structure compliant off-chip interconnects have been optimized based upon electrical inductance (e.g., self-inductance), mechanical compliance (e.g., compliance in the x-y-z directions), and thermo-mechanical properties (e. g., accommodate coefficient of thermal expansion mismatches between different materials).

Electronic packages (e.g.,semiconductor based packages) including free-standing arcuate structure compliant off-chip interconnects do not need an underfill and/or flexible interposer to achieve compliance. In addition, the multi-directional compliance of the free-standing arcuate structure compliant off-chip interconnects can accommodate more differential displacement due to the coefficient of thermal expansion mismatch of different materials during thermal cycling in electronic packaging than conventional interconnect structures. Further, the fabrication of the free-standing arcuate structure compliant off-chip interconnects can be integrated into wafer-level processing as a batch process, and therefore, the cost of the fabrication can be reduced.

Now having described the free-standing arcuate structure compliant off-chip interconnects in general, examples 1–5 describe some embodiments of the free-standing arcuate structure compliant off-chip interconnect. While embodiments of the free-standing arcuate structure compliant off-chip interconnect are described in connection with examples 1–5 and the corresponding text, there is no intent to limit embodiments of the free-standing arcuate structure compliant off-chip interconnect to these descriptions. On the contrary, the intent is to cover all alternatives, modifications, and equivalents included within the spirit and scope of the present invention.

In addition, the following presentations and/or papers further describe embodiments of the present invention: "Mechanical and Preliminary Electrical Design of a Novel Compliant One-Turn Helix (OTH) Interconnect" presented at InterPACK'01 The PACIFIC RIM/International, Intersociety, Electronic Packaging Technical/Business Conference and Exhibition, Jul. 8–13, 2001 in Kauai, Hi.; "Alternative Compliant Interconnects-Thermo-mechanical Reliability, Design and Testing" presented at the 2001 ASME International Mechanical Engineering Congress and Exposition, Nov. 11–16, 2001 in New York, N.Y.; "Thermo-mechanical Design and Analysis of a Novel Compliant Interconnect-One-Turn Helix" submitted to ITHERM 2002. Each of these presentations and/or papers is entirely incorporated herein by reference.

EXAMPLE 1

Figure 1B:
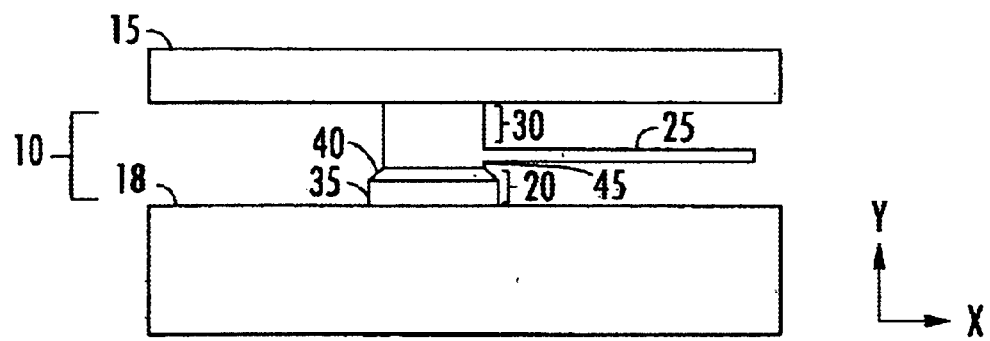
FIG. 1B illustrates a side (xy axis) view of the off-chip interconnect shown in FIG. 1A.
Figure 1C:
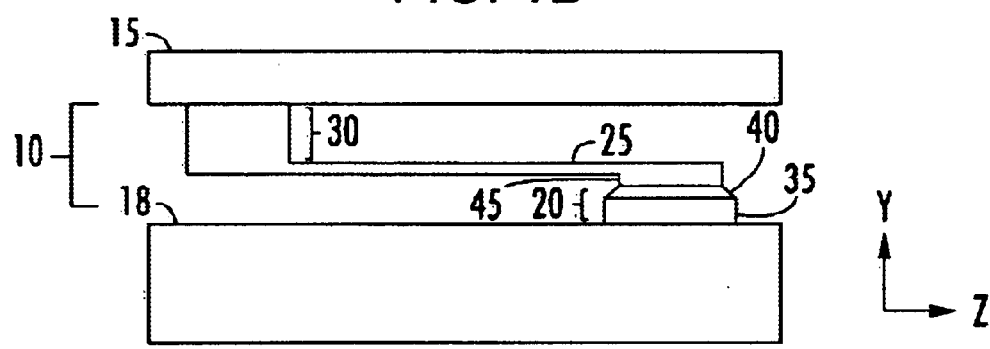
FIG. 1C illustrates a side (zy axis) view of the off-chip interconnect shown in FIG. 1A.
Figure 1D:
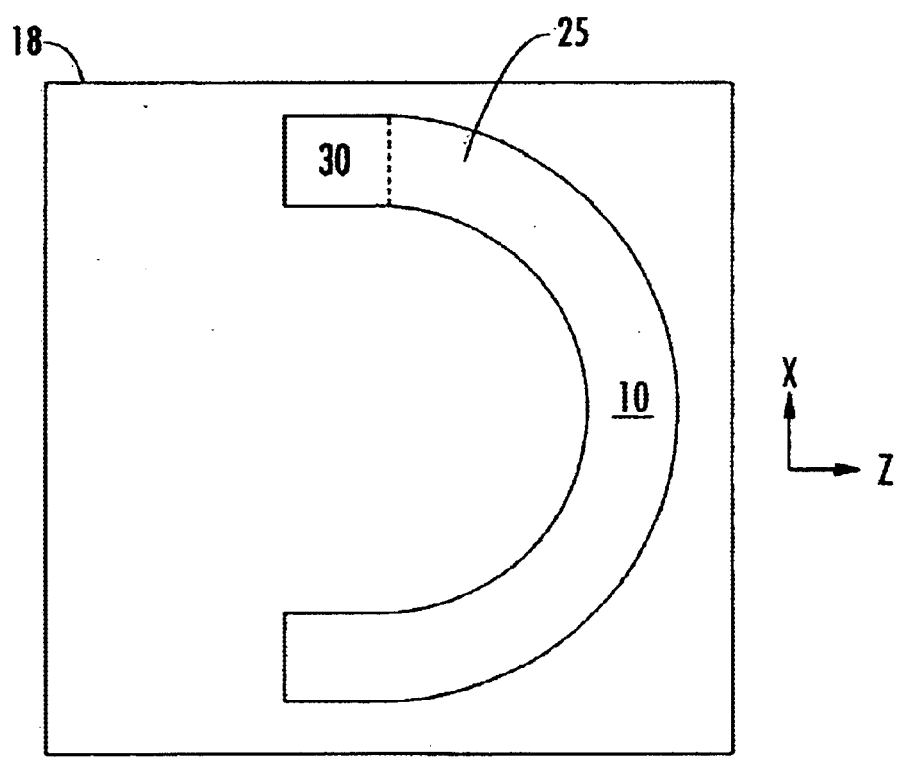
FIG. 1D illustrates a top view of the off-chip interconnect shown in FIG. 1A.

FIGS. 1A–1D illustrate a perspective view, a first side view (xy axis), a second side view (zy axis), and a top view, respectively, of a single arcuate structure compliant off-chip interconnect 10. FIGS. 1A and 1D depict the single arcuate structure compliant off-chip interconnect 10 connected (e.g., secured to, mounted to, affixed to, etc.) to an assembly substrate 18 (e.g., ceramic, glass, quartz material, printer circuit board, etc.), while FIGS. 1B and 1C depict the single arcuate structure compliant off-chip interconnect 10 connected to a fabrication substrate 15 (e.g., semiconductors, such as germanium, selenium, silicon, silicon carbide, ceramic, glass, quartz, etc.) and the assembly substrate 18. The fabrication substrate 15 has been omitted from FIGS. 1A and 1D for clarity and, as will become apparent below, the single arcuate structure compliant off-chip interconnect 10 is fabricated upon the fabrication substrate 15 and subsequently connected to the assembly substrate 18.

The single arcuate structure compliant off-chip interconnect 10 includes a first arcuate (e.g., semi-circular, curved, or semi-helical) structure 25 and a pillar 20. The first arcuate structure 25 is substantially parallel to the fabrication substrate 15 and/or the assembly substrate 18, while the assembly post 45 and pillar 20 are substantially perpendicular to the fabrication substrate 15 and/or the assembly substrate 18. The assembly post 45 can be connected with a first portion (e.g., bottom, side, and top) of the first arcuate structure 25. In addition, the assembly post 45 can be connected to the assembly substrate 18 through pillar 20. In other embodiments, the assembly post 45 and first arcuate structure 25 can be connected with a bridge structure (shown in FIGS. 6A–6D and 8A–8D).

In addition, the first arcuate structure compliant off-chip interconnect 10 can include a fabrication post 30. The fabrication post 30 is substantially perpendicular to the fabrication substrate 15 and/or the assembly substrate 18. The fabrication post 30 can be connected with a second portion (e.g., bottom, side, and top) of the first arcuate structure 25. In addition, the fabrication post 30 can be connected with the fabrication substrate 15. Typically, the assembly post 45 and the fabrication post 30 are interconnected with the first arcuate structure 25 at opposite ends of the first arcuate structure 25.

The first arcuate structure 25 can be fabricated from metals, such as copper (Cu) composites, metal composites, etc. The first arcuate structure 25 can have a thickness of about 3 to about 30 micrometers, a width of about 5 to about 50 micrometers, and a mean radius of about 5 to about 100 micrometers. Preferably, the first arcuate structure 25 has a thickness of about 10 micrometers, a width of about 20 micrometers, and a mean radius of about 40 micrometers. The mean radius of the first arcuate structure is defined as the distance from the geometric center of the arcuate to the center-line of the arcuate structure 25. The fabrication post 30 and the assembly post 45 can have a height of about 5 to about 50 micrometers. Preferably, the fabrication post 30 and assembly post 45 should have a height of about 20 micrometers.

The assembly post 45 is attached to a bondpad 35 on the assembly substrate 18 using, for example, solder past 40. The solder paste structure 40 can be high modulus solders such as gold/tin or silver/tin, for example.

Generally, the first arcuate structure 25, the fabrication post 30 and the assembly post 45 are fabricated from the same arcuate structure material. However, the first arcuate structure 25, the fabrication post 30, and the assembly post 45 can be fabricated of one or more materials.

The single arcuate structure compliant off-chip interconnect 10 can be fabricated using conventional photolithography based integrated circuit fabrication techniques. In general, after depositing, masking, and etching each metal layer, the single arcuate structure compliant off-chip interconnect 10 is fabricated through photosensitive sacrificial layers (e.g., polymer, epoxy, etc.). Subsequently, the sacrificial layers can be etched away to form the free-standing single arcuate structure compliant off-chip interconnect 10.

Now referring to a representative fabrication process, FIGS. 2A–2G are schematics of a representative process for fabricating the single arcuate structure compliant offship interconnect 10 shown in FIGS. 1A–1D. For clarity, some portions of the fabrication process are not included in FIGS. 2A–2G. For example, seed layers may be used to form portion 10B and 10C in FIGS. 2C and 2E below, but for clarity the seed layers are not represented in these figures.

Figure 2A:
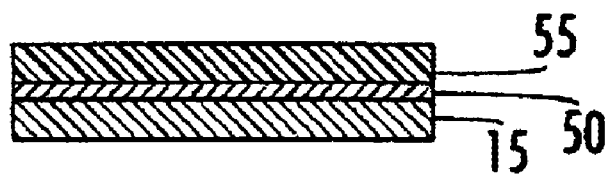
FIGS. 2–2G are schematics of a representative process for fabricating the single arcuate structure compliant off-chip interconnect shown in FIGS. 1A–1D.

FIG. 2A is a schematic illustrating the fabrication substrate 15 having a seed layer 50 deposited thereon. In addition, the seed layer 50 has a sacrificial layer 55 disposed thereon. The seed layer 50 can be any material (e.g., metal, composite, etc.) that facilitates the deposition of the single arcuate structure compliant off-chip interconnect 10 upon the fabrication substrate 15. The sacrificial layer 55 can be any material (e.g. polymer, epoxy, etc.) that facilitates the formation of the single arcuate structure compliant off-chip interconnect 10.

Figure 2B:
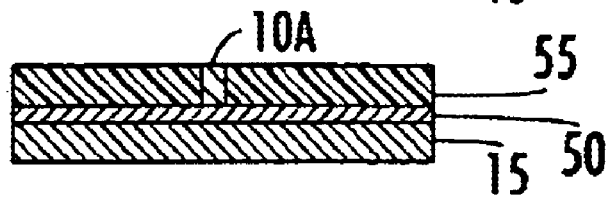

FIG. 2B is a schematic that illustrates the formation of portion 10A of the single arcuate structure compliant off-chip interconnect 10 after a portion of the seed layer 50 and the sacrificial layer 55 have been etched. Portion 10A includes fabrication post 30.

Figure 2C:
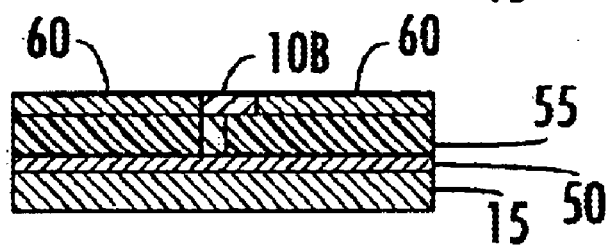

FIG. 2C is a schematic that illustrates the formation of portion 10B of the single arcuate structure compliant off-chip interconnect 10 onto portion 10A and the sacrificial layer 55 through a portion of a photoresist layer 60. Portion 10B includes the first arcuate structure 25.

Figure 2D:
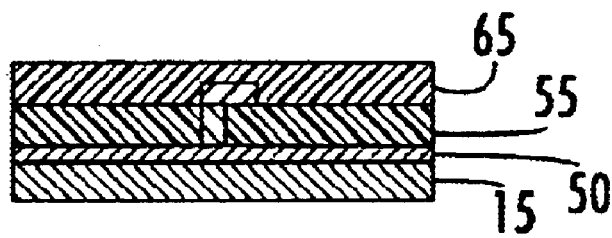

FIG. 2D is a schematic that illustrates the formation of a second sacrificial layer 65 over the first sacrificial layer 55 and portion 10B of the single arcuate structure compliant off-hip interconnect 10 after the photoresist layer 60 has been removed.

Figure 2E:
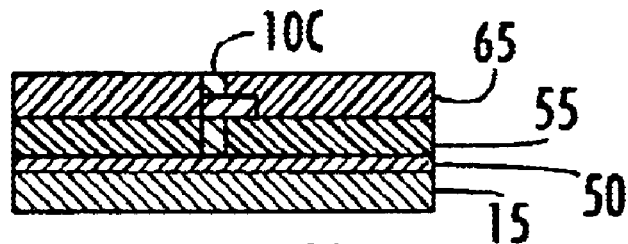

FIG. 2E is a schematic that illustrates the formation of portion 10C of the single arcuate structure compliant off-chip interconnect 10 onto portion 10B after developing (e.g., wet etching) a portion of the second sacrificial layer 65. Portion 10C includes the assembly post 45.

Figure 2F:
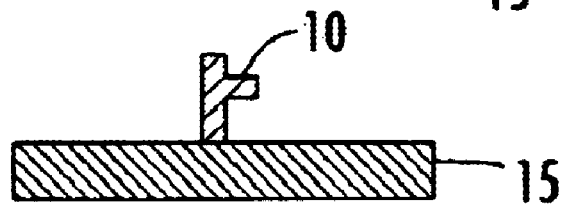
Figure 2G:
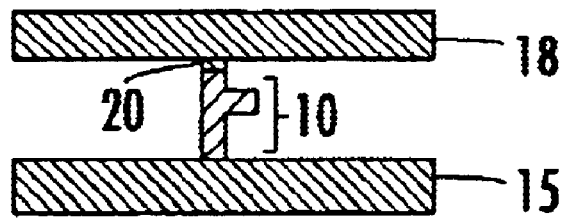

FIG. 2F is a schematic that illustrates the removal of the first and second sacrificial layers 55 and the 65 and seed layer 50, thereby exposing portions 10–10C (not shown as separate portions) which form the single arcuate structure compliant off-chip interconnect 10. FIG. 2G is a schematic that illustrates the connection of the single arcuate structure compliant off-chip interconnect 10 to the pillar 20 on the assembly substrate 18. Subsequently, the single arcuate structure compliant off-chip interconnect 10 can be disconnected from the fabrication substrate 15.

EXAMPLE 2

Figure 3A:
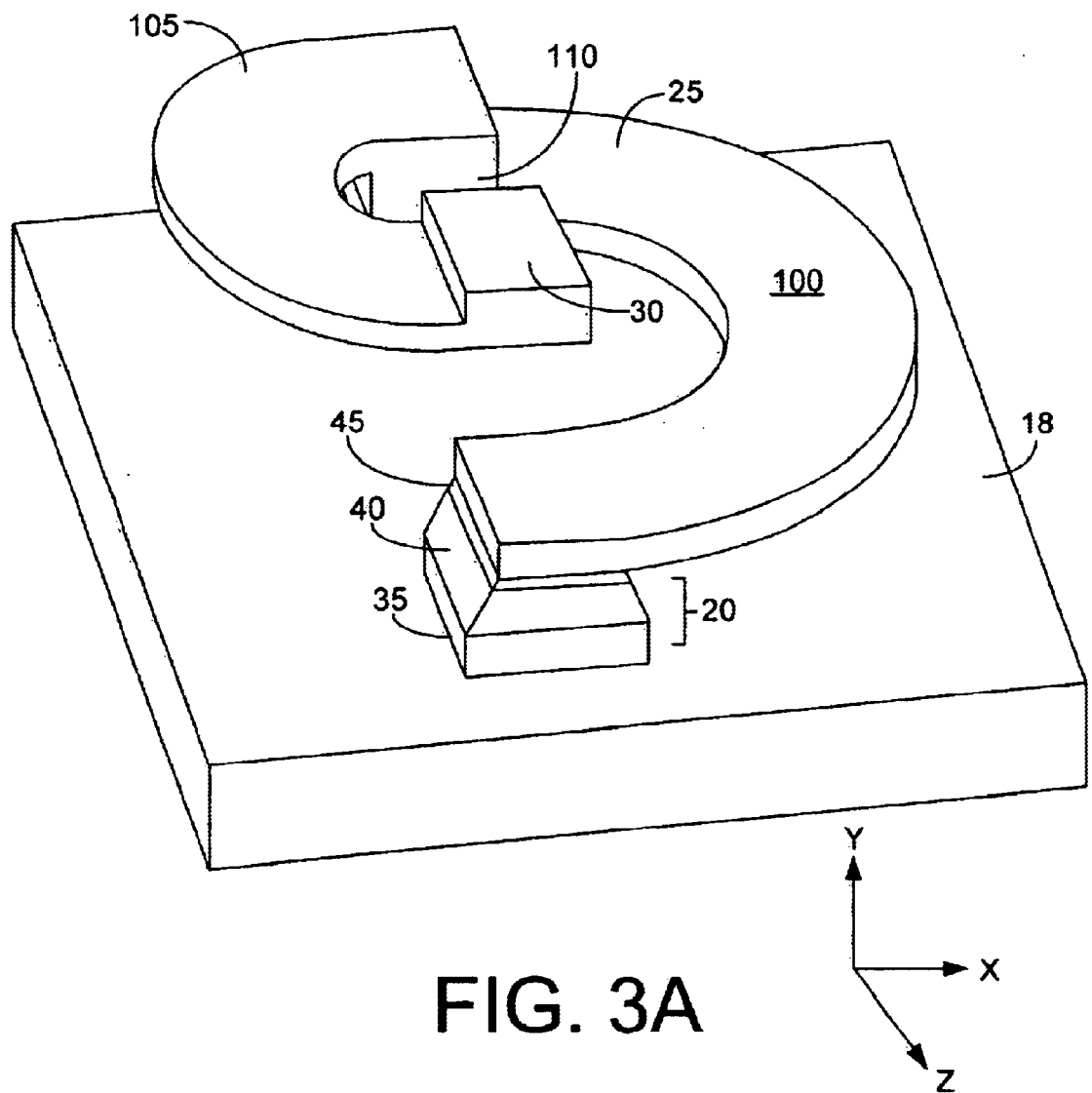
FIG. 3A illustrates a perspective view of an asymmetrical double arcuate structure compliant off-chip interconnect.
Figure 3B:
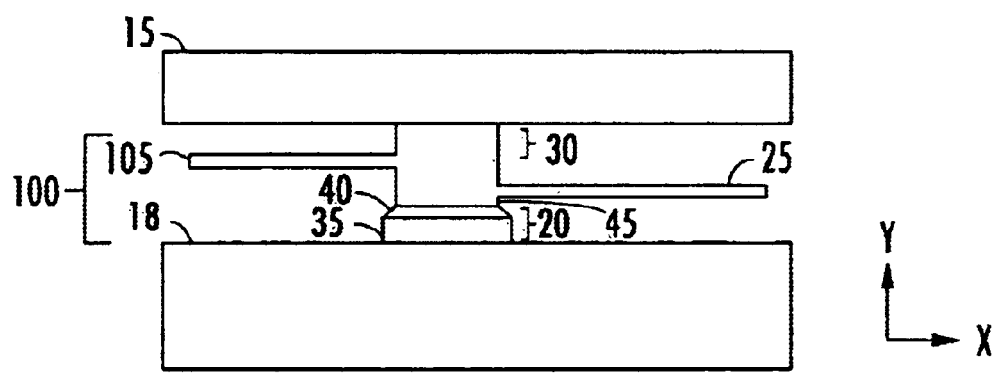
FIG. 3B illustrates a side (xy axis) view of the asymmetrical double arcuate structure compliant off-chip interconnect shown in FIG. 3A.
Figure 3C:
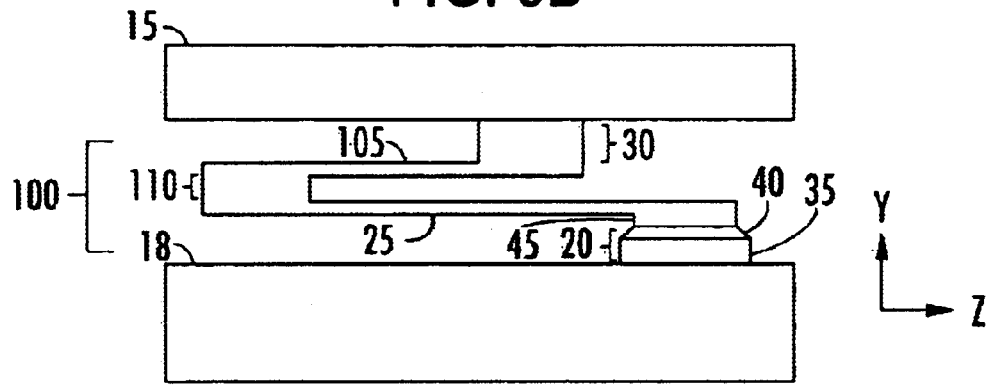
FIG. 3C illustrates a side (zy axis) view of the asymmetrical double arcuate structure compliant off-chip interconnect shown in FIG. 3A.
Figure 3D:
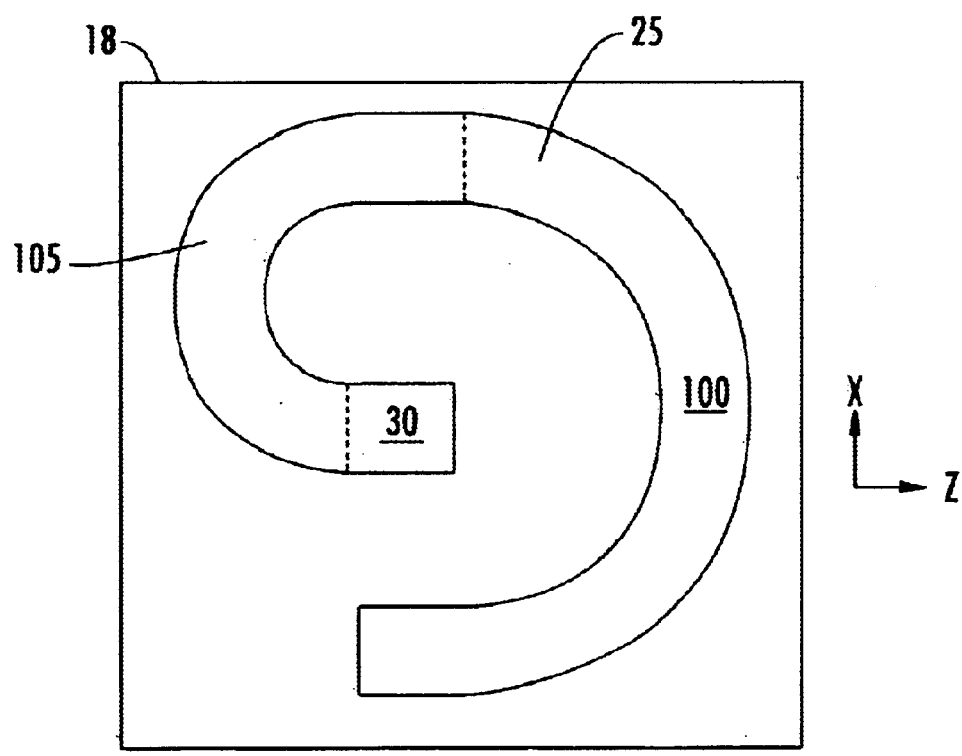
FIG. 3D illustrates a top view of the asymmetrical double arcuate structure compliant off-chip interconnect shown in FIG. 3A.

FIGS. 3A–3D illustrate a perspective, a first side (xy axis), a second side view (zy axis), and a top view, respectively, of an asymmetrical double arcuate structure compliant off-chip interconnect 100. FIGS. 3A and 3D depict the asymmetrical double arcuate structure compliant off-chip interconnect 100 connected to the assembly substrate 18, while FIGS. 3B and 3C depict the asymmetrical double arcuate structure compliant off-chip interconnect 100 connected with the fabrication substrate 15. The fabrication substrate 15 has been omitted from FIGS. 3A and 3D for clarity and, as will become apparent below, asymmetrical double arcuate structure compliant off-chip interconnect 100 is fabricated upon the fabrication substrate 15 and subsequently connected to the assembly substrate 18.

The asymmetrical double arcuate structure compliant off-chip interconnect 100 includes the first arcuate (e.g. semi-circular, curved, or semi-helical) structure 25, discussed in relation to FIGS. 1A–1D and 2–2F, and a second arcuate structure 105. The first arcuate structure 25 and the second arcuate structure 105 are substantially parallel to the fabrication substrate 15 and/or the assembly substrate 18, while also being substantially parallel to one another.

In addition, the asymmetrical double arcuate structure compliant off-chip interconnect 100 can include the fabrication post 30, a middle post 110, and the assembly post 45. The middle post 110 can be connected with the second portion of the first arcuate structure 25 and a first portion of the second arcuate structure 105. The fabrication post 30 is connected to a second portion of the second arcuate structure 105 and a portion of the fabrication substrate 15. Typically, the fabrication post 30 and the middle post 110 are connected with the second arcuate structure 105 at opposite ends of the second arcuate structure 105. The assembly post 45 is connected to the first arcuate structure 100 and the pillar 20. Details regarding the first arcuate structure 25, the pillar 20, the fabrication post 30, and the assembly post 45 have been described above with reference to FIGS. 1A–1D.

Like the first arcuate structure 25, the second arcuate structure 105 can be fabricated from metals such as copper composites, metal composites, etc. The second arcuate structure 105 can have a thickness of about 3 to about 30 micrometers, a width of about 5 to about 50 micrometers, and a mean radius of about 5 to about 100 micrometers. Preferably, the second arcuate structure 105 has a thickness of about 10 micrometers, a width of about 20 micrometers, and a mean radius of about 40 micrometers. Typically, the mean radius of the second arcuate structure 105 has a mean radius that is approximately half that of the first arcuate structure 25. The middle second post 110 can have a height of about 5 to about 50 micrometers. Preferably, the middle post has a height of about 20 micrometers.

Generally, the first arcuate structure 25, the second arcuate structure 105, the fabrication post 30, the assembly post 45, and the middle post 110 are fabricated from the same arcuate structure material. However, the first arcuate structure 25, the second arcuate structure 105, the fabrication post 30, the assembly post 45, and the middle post 110 can be fabricated of one or more materials.

In a manner similar to the fabrication of the single arcuate structure compliant off-chip interconnect 10 described in FIGS. 2A–2F, the asymmetrical double arcuate structure compliant off-chip interconnect 100 can be fabricated using conventional photolithography based integrated circuit fabrication techniques. In general, after depositing, masking, and etching for each metal layer, the asymmetrical double arcuate structure compliant off-chip interconnect 100 is fabricated through photosensitive sacrificial layers (e.g., polymer). Subsequently, the sacrificial layers can be etched away to form the free-standing asymmetrical double arcuate structure compliant off-chip interconnect 100.

Now referring to a representative fabrication process, FIGS. 4A–4K are schematics of a representative process for fabricating the asymmetrical double arcuate structure compliant off-chip interconnect 100 shown in FIGS. 3A–3D. For simplicity and clarity, some steps of the fabrication process (e.g., depositing, masking, and etching) are not included in FIGS. 4A–4I. For example, seed layers may be used to form portions 100B, 100C, 100D, and 100E in FIGS. 4C, 4E, 4F, and 4H below, but the seed layers are not represented in the these figures.

FIG. 4A is a schematic illustrating first substrate 15 having a seed layer 50 deposited thereon. In addition, the seed layer 50 has a sacrificial layer 55 disposed thereon.

FIG. 4B is a schematic that illustrates the formation of portion 100A of the asymmetrical double arcuate structure compliant off-chip interconnect 100 after a portion of the seed layer 50 and the sacrificial layer 55 have been etched. Portion 100A includes the fabrication post 30.

FIG. 4C is a schematic that illustrates the formation of portion 100B of the asymmetrical double arcuate structure compliant off-chip interconnect 100 onto portion 100A and the sacrificial layer 55 through a portion of a photoresist layer 60 using conventional deposition techniques. Portion 100B includes the second arcuate structure 105.

FIG. 4D is a schematic that illustrates the formation of a second sacrificial layer 65 over the first sacrificial layer 55 and portion 100B of the asymmetrical double arcuate structure compliant off-chip interconnect 100 after the photoresist layer 60 has been removed.

FIG. 4E is a schematic that illustrates the formation of portion 100C of the asymmetrical double arcuate structure compliant off-chip interconnect 100 onto portion 100B after etching a portion of the second sacrificial layer 65. Portion 100C includes the middle post 110.

FIG. 4F is a schematic that illustrates the formation of portion 100D of the asymmetrical double arcuate structure compliant off-chip 100 onto the sacrificial layer 65 through a portion of a photoresist layer 60. Portion 100D includes the first arcuate structure 25.

FIG. 4G is a schematic that illustrates the formation of a third sacrificial layer 120 over the first sacrificial layer 65 and portion 100D of the asymmetrical double arcuate structure compliant off-chip 100.

FIG. 4H is a schematic that illustrates the formation of portion 100E of the asymmetrical double arcuate structure compliant off-chip 100 after etching a portion of the second sacrificial layer 120. Portion 100E includes the assembly post 45.

FIG. 4I is a schematic that illustrates the removal of the first, second, and third sacrificial layers 55, 65, and 120 and the seed layer 50, thereby exposing portions 100A–100E (not shown as separate portions) which form the asymmetrical double arcuate structure compliant off-chip interconnect 100.

FIG. 4J is a schematic that illustrates the connection of the asymmetrical double arcuate structure compliant off-chip interconnect 100 to the pillar 20 on the assembly substrate 18. Subsequently, the asymmetrical double arcuate structure compliant off-chip interconnect 100 can be disconnected from the fabrication substrate 15.

EXAMPLE 3

Figure 5A:
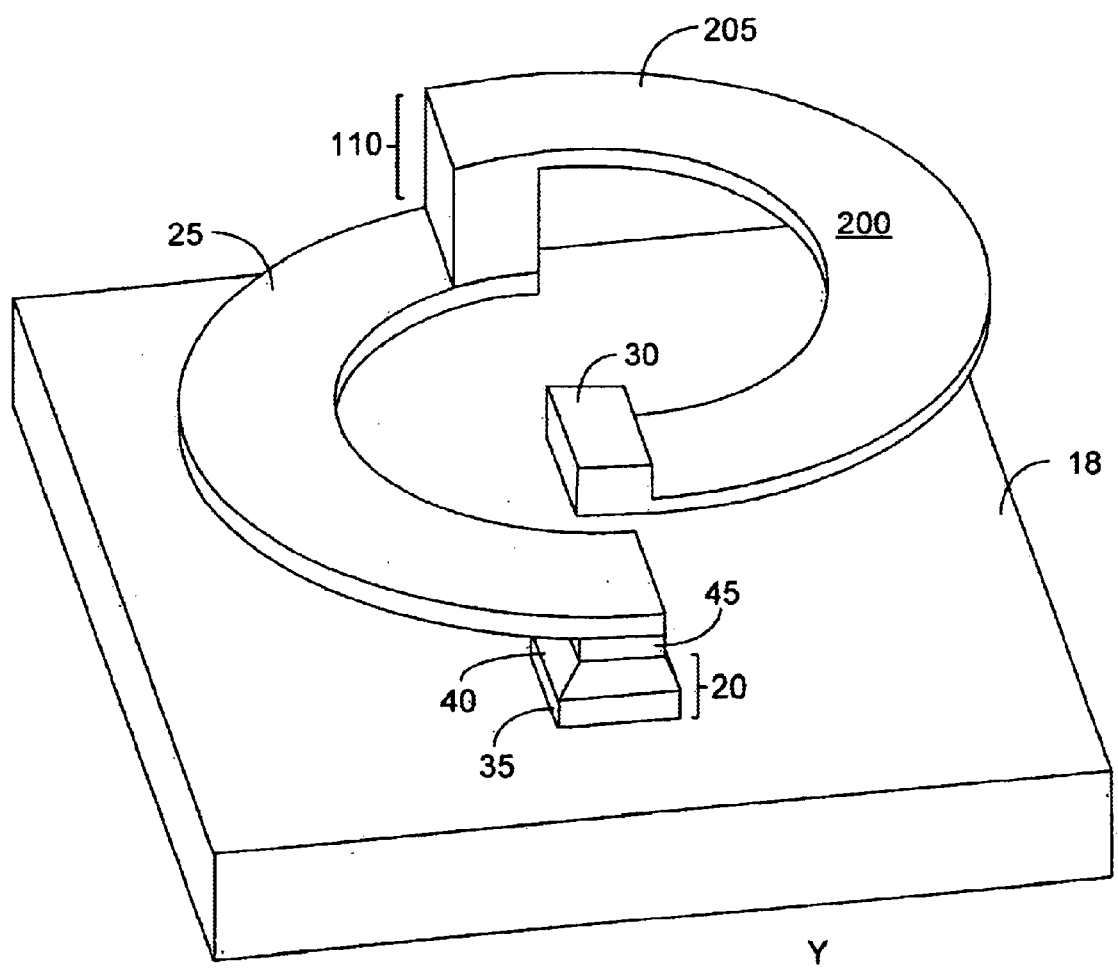
FIG. 5A illustrates a perspective view of a symmetrical double arcuate structure compliant off-chip interconnect.
Figure 5B:
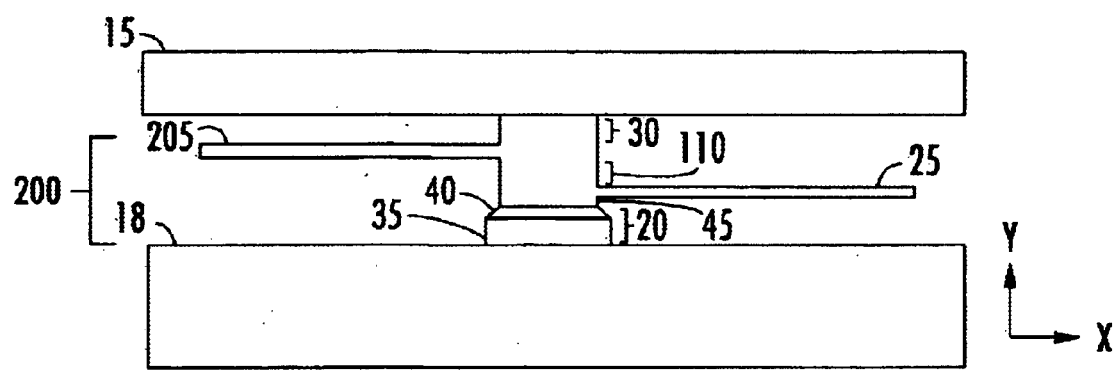
FIG. 5B illustrates a side (xy axis) view of the symmetrical double arcuate structure compliant off-chip interconnect, shown in FIG. 5A.
Figure 5C:
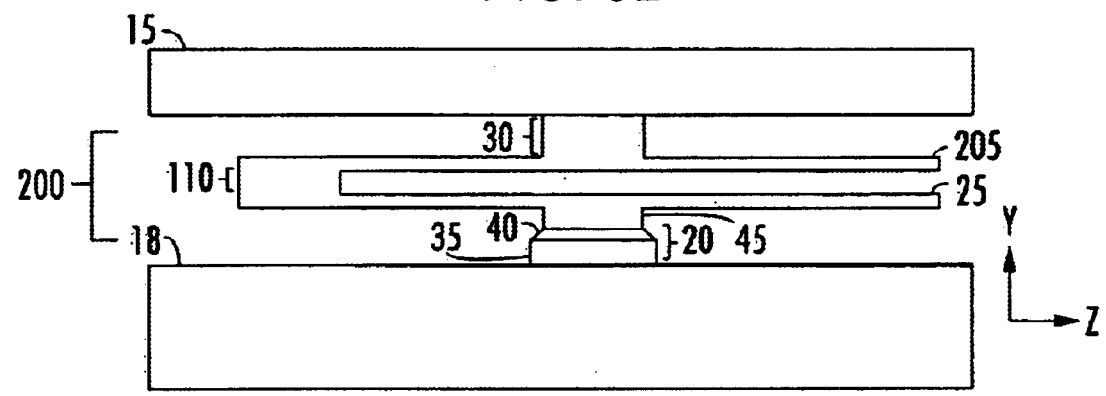
FIG. 5C illustrates a side (zy axis) view of the symmetrical double arcuate structure compliant off-chip interconnect shown in FIG. 5A.
Figure 5D:
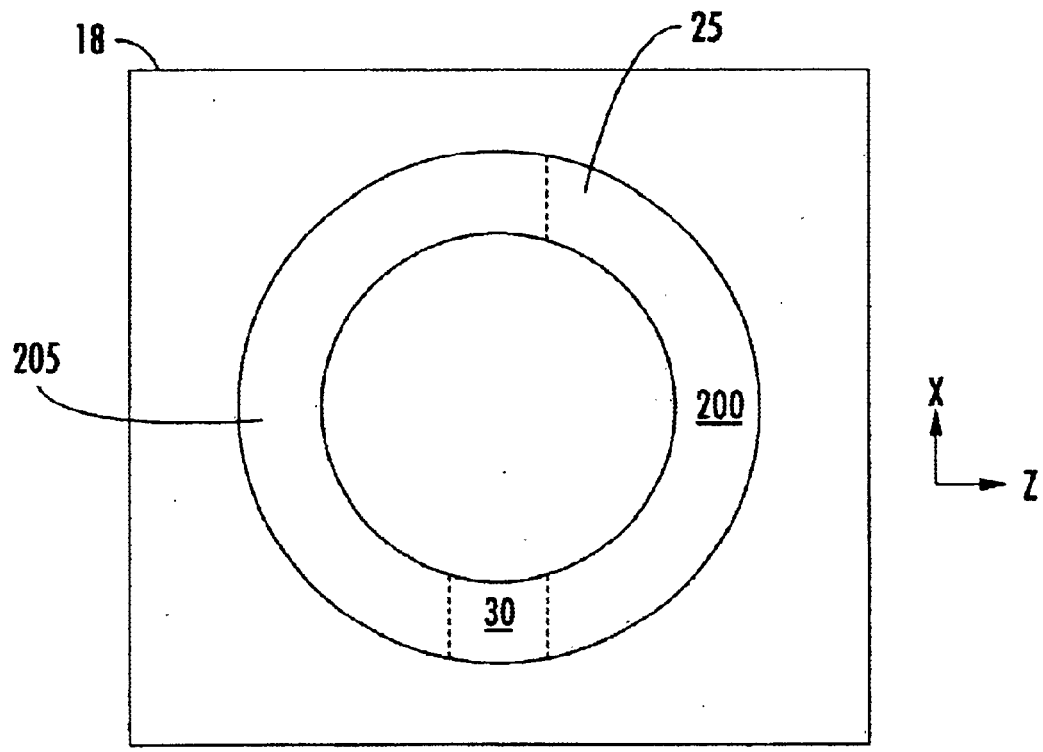
FIG. 5D illustrates a top view of the symmetrical double arcuate structure compliant off-chip interconnect shown in FIG. 5A.

FIGS. 5A–5D illustrate a perspective, a first side (xy axis), a second side (zy axis), and a top view, respectively, of a symmetrical double arcuate structure compliant off-chip interconnect 200. FIGS. 5A and 5D depict the symmetrical double arcuate structure compliant off-chip interconnect 200 the assembly substrate 18, while FIGS. 5B and 5C depict symmetrical double arcuate structure compliant off-chip interconnect 200 connected to the fabrication substrate 15. The fabrication substrate 15 has been omitted from FIGS. 5A and SD for simplicity and clarity and, as will become apparent below, the symmetrical double arcuate structure compliant off-chip interconnect 200 is fabricated upon the fabrication substrate 15 and subsequently connected to the assembly substrate 18.

The symmetrical double arcuate structure compliant off-chip interconnect 200 includes the first arcuate (e.g. semi-circular, curved, or semi-helical) structure 25, as discussed in reference to FIGS. 3A–3D, and a third arcuate structure 205. The first arcuate structure 25 and the third arcuate structure 205 are substantially parallel to the fabrication substrate 15 and the assembly substrate 18, while also being substantially parallel to one another.

In addition, the symmetrical double arcuate structure compliant off-chip interconnect 200 can include the fabrication post 30, the assembly post 45, and the middle post 110. The middle post 110 can be connected with the second portion of the first arcuate structure 25 and first portion of the third arcuate structure 205. The fabrication post 30 is connected to a second portion of the third arcuate structure 205 and the fabrication substrate 15. Typically, the fabrication post 30 and the middle post 110 are connected with the third arcuate structure 205 at opposite ends of the third arcuate structure 205. The assembly post 45 can be connected to the pillar 20 and the first arcuate structure 25.

Details regarding the first arcuate structure 25, the pillar 20, the fabrication post 30, the middle second post 110, and the assembly post 45 have been described above with reference to FIGS. 1A–1D and 3A–3D.

The third arcuate structure 205 can be fabricated from metals, composites, metal composites, etc., such as copper.

The third arcuate structure 205 can have a thickness of about 3 to about 30 micrometers, a width of about 5 to about 50 micrometers, and a mean radius of about 5 to about 50 micrometers. Preferably, the third arcuate structure 205 has a thickness of about 10 micrometers, a width of about 20 micrometers, and a mean radius of about 40 micrometers. Typically, the third arcuate structure 205 has a mean radius that is approximately equivalent to the mean radius of the first arcuate structure 25.

Generally, the first arcuate structure 25, the third arcuate structure 205, the fabrication post 30, the middle post 110, and the assembly post 35 are fabricated from the same arcuate structure material. However, the first arcuate structure 25, the third arcuate structure 205, the fabrication post 30, the middle post 110, and the assembly post 45 can be fabricated of one or more materials.

In a manner similar to the fabrication of the asymmetrical double arcuate structure compliant off-chip interconnect 200 described in FIGS. 2A–2D and 3A–3I, the syrmnetrical double arcuate structure compliant off-chip interconnect 200 can be fabricated using conventional photolithography based integrated circuit fabrication techniques. In general, after depositing, masking, and etching for each metal layer, the symmetrical double arcuate structure compliant off-chip interconnect 200 is fabricated through photosensitive sacrificial layers (e.g., polymer). Subsequently, the sacrificial layers can be etched away or otherwise removed to form the free-standing symmetrical double arcuate structure compliant off-chip interconnect 200.

The representative fabrication process described in FIGS. 4A–4I or a similar process can be used to fabricate the symmetrical double arcuate structure compliant off-chip interconnect 200 shown in FIGS. 5A–5D. It should be noted that the mean radius of the third arcuate structure 205 is greater than the mean radius of the second arcuate structure 105. Therefore, modifications to the fabrication process described in FIG. 4F–4I would reflect this change in dimension.

EXAMPLE 4

Figure 6A:
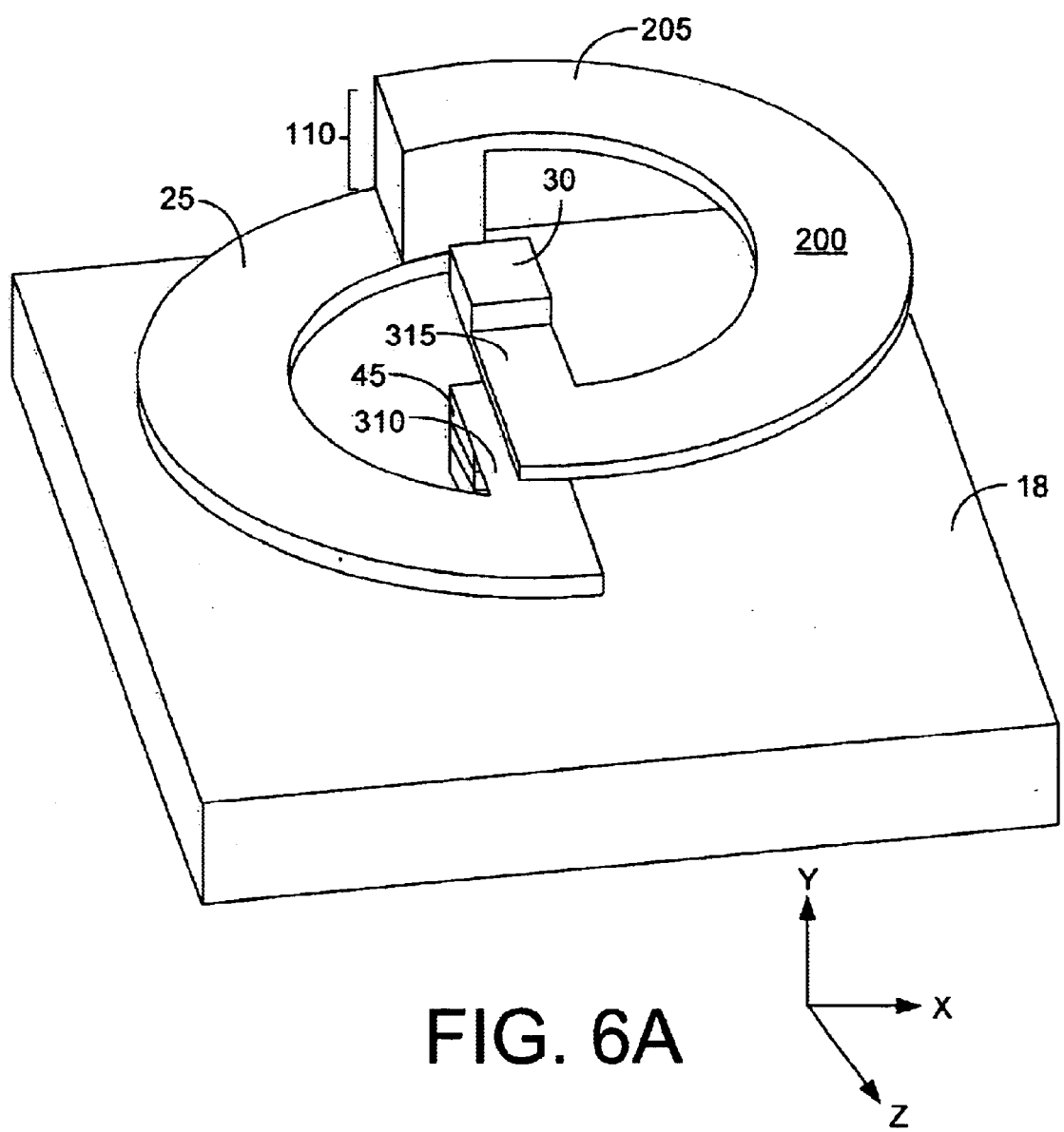
FIG. 6A illustrates a perspective view of a double arcuate structure compliant off-chip interconnect.
Figure 6B:
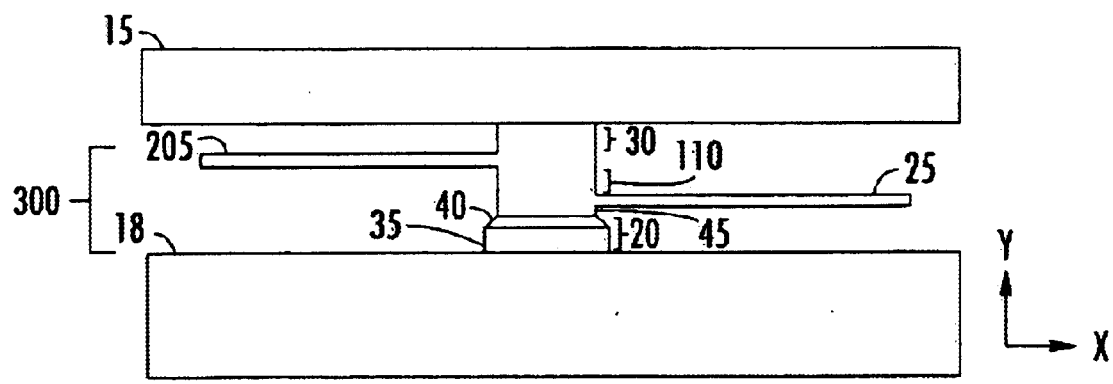
FIG. 6B illustrates a side (xy axis) view of the double arcuate structure compliant off-chip interconnect shown in FIG. 6A.
Figure 6C:
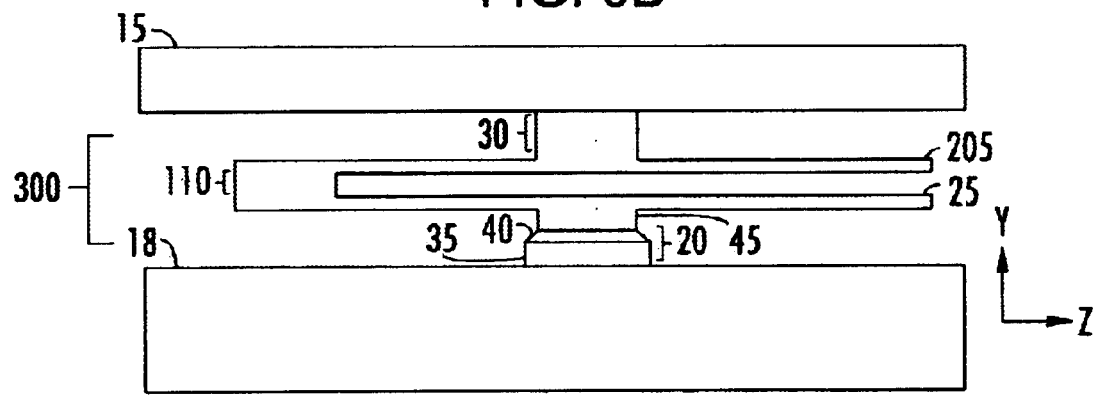
FIG. 6C illustrates a side (zy axis) view of the double arcuate structure compliant off-chip interconnect shown in FIG. 6A.
Figure 6D:
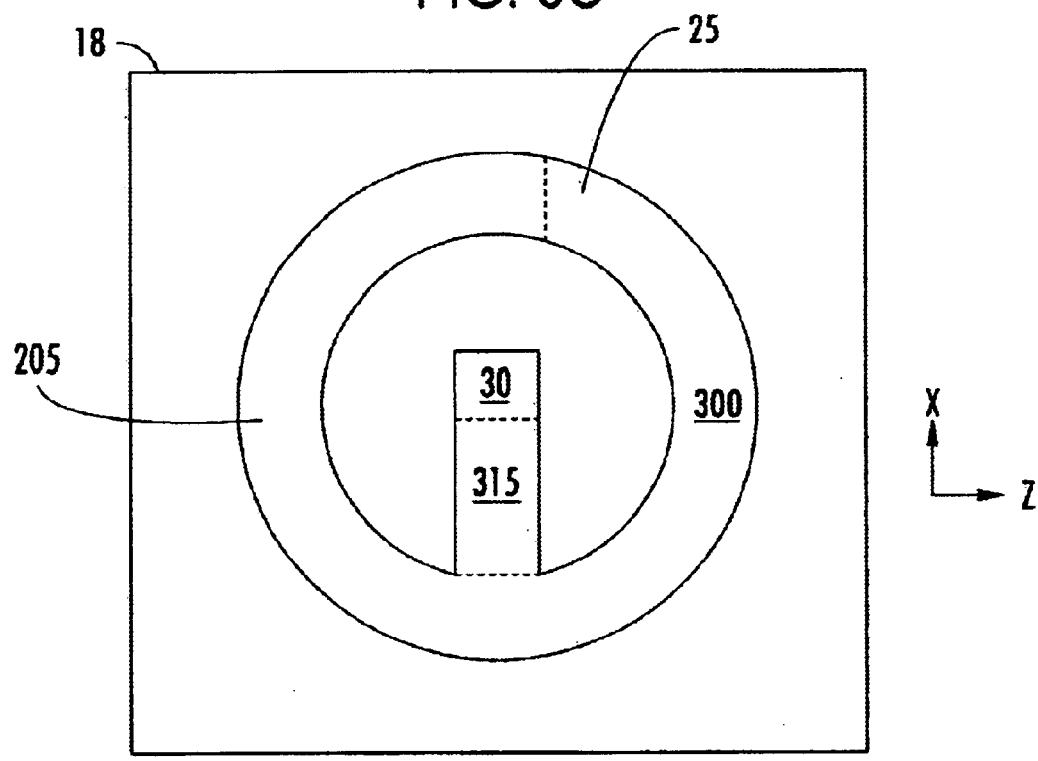
FIG. 6D illustrates a top view of the double arcuate structure compliant off-chip interconnect shown in FIG. 6A.

FIGS. 6A–6D are schematics that illustrate a perspective view, a first side view (xy axis), a second side view (zy axis), and a top view, respectively, of a double arcuate structure compliant off-chip interconnect 300. FIGS. 6A and 6D depict the double arcuate structure compliant off-chip interconnect 300 the assembly substrate 18, while FIGS. 6B and 6C depict double arcuate structure compliant off-chip interconnect 300 connected to the fabrication substrate 15. The fabrication substrate 15 has been omitted from FIGS. 6A and 6D for clarity and, as will become apparent below, the double arcuate structure compliant off-chip interconnect 300 is fabricated upon the fabrication substrate 15 and subsequently connected to the assembly substrate 18.

The double arcuate structure compliant off-chip interconnect 300 includes the first arcuate (e.g. semi-circular, curved, or semi-helical) structure 25, the pillar 20, the third arcuate structure 205, the fabrication post 30, the assembly post 45, the middle post 110, as discussed in reference to FIGS. 5A–5D, as well as a first bridge 310 and a second bridge 315. It should be noted that the symmetrical double arcuate structure compliant off-chip interconnect 200 illustrated in FIGS. 5A–5D does not include the first bridge 310 and the second bridge 315 connections.

The first arcuate structure 25 and the third arcuate structure 205 are substantially parallel to the fabrication substrate 15 and the assembly substrate 18, while also being substantially parallel to one another. The assembly post 45 can be connected to a first portion of the first bridge 310, while a second portion of the first bridge 315 is connected to the first portion of the first arcuate structure 25. The first arcuate structure 25 is connected to a lower portion of the middle post 110, while the third arcuate structure 205 is connected to an upper portion of the middle post 110. A first portion of the second bridge 315 is connected to the third arcuate structure 205, while a second portion of the second bridge 315 is connected to the fabrication post 30. The fabrication post 30 is connected to the fabrication substrate 15. The assembly post 45 is connected to the assembly substrate through pillar 20.

Details regarding the first arcuate structure 25, the pillar 20, the third arcuate structure 205, the fabrication post 30, the middle post 110, and the assembly post 45 have been described above with reference to FIGS. 1A–1D, 3A–3D, and 5A–5D. In addition, the double arcuate structure compliant off-chip interconnect 300 can be symmetrical (FIG. 6A–6D) or asymmetrical (not shown).

The first bridge 310 and the second bridge 315 can be fabricated from metals, such as copper composites, metal composites, etc. The first bridge 310 and the second bridge 315 each can have a thickness of about 3 to about 30 micrometers and a width of about 5 to about 50 micrometers. Preferably, the first bridge 310 and the second bridge 315 each has a thickness of about 10 micrometers and a width of about 20 micrometers.

Generally, the first arcuate structure 25, the third arcuate structure 205, the fabrication post 30, the middle post 110, the assembly post 45, the first bridge 310, and the second bridge 315 are fabricated from the same arcuate structure material. However, the first arcuate structure 25, the third arcuate structure 205, the fabrication post 30, the middle post 110, the assembly post 45, the first bridge 310, and the second bridge 315 can be fabricated of one or more materials.

In a manner similar to the fabrication of the asymmetrical double arcuate structure compliant off-chip interconnect 100 and the symmetrical double arcuate structure compliant off-chip interconnect 200 described in FIGS. 3A–3D and 4A–4I and FIGS. 5A–5D, respectively, the double arcuate structure compliant off-chip interconnect 300 can be fabricated using conventional photolithography based integrated circuit fabrication techniques. In general, after depositing, masking, and etching for each metal layer, the double arcuate structure compliant off-chip interconnect 300 is fabricated through photosensitive sacrificial layers (e.g., polymer). Subsequently, the sacrificial layers can be etched away to form the free-standing double arcuate structure compliant off-chip interconnect 300.

Now referring to a representative fabrication process, FIGS. 7A–7J are schematics of a representative process for fabricating the double arcuate structure compliant off-chip interconnect 300 shown in FIGS. 6A–6D. For simplicity and clarity, some portions of the fabrication process (e.g., depositing, masking, and etching) are not included in FIGS. 7A–7J. For example, seed layers may be used to form portions 300B, 300C, 300D, and 300E in FIGS. 7C, 7E, 7F, and 7H below, but the seed layers are not represented in those figures.

FIG. 7A is a schematic illustrating first substrate 15 having a seed layer 50 deposited thereon. In addition, the seed layer 50 has a sacrificial layer 55 disposed thereon.

FIG. 7B is a schematic that illustrates the formation of portion 300A of the double arcuate structure compliant off-chip interconnect 300 after a portion of the seed layer 50 and the sacrificial layer 55 have been etched. Portion 300A includes the fabrication post 30.

FIG. 7C is a schematic that illustrates the formation of portion 300B of the double arcuate structure compliant off-chip interconnect 300 onto portion 300A and the sacrificial layer 55 through a portion of a photoresist layer 60. Portion 300B includes third arcuate structure 205 and the second bridge 315.

FIG. 7D is a schematic that illustrates the formation of a second sacrificial layer 65 over the first sacrificial layer 55 and portion 300B of the double arcuate structure compliant off-chip interconnect 300 after the photoresist layer 60 has been removed.

FIG. 7E is a schematic that illustrates the formation of portion 300C of the double arcuate structure compliant off-chip interconnect 300 onto portion 300B after etching a portion of the second sacrificial layer 65. Portion 300C includes the middle post 110.

FIG. 7F is a schematic that illustrates the formation of portion 300D of the double arcuate structure compliant off-chip 300 onto the sacrificial layer 65 through a portion of a photoresist layer 60. Portion 300D includes the first arcuate structure 25 and the first bridge 310.

FIG. 7G is a schematic that illustrates the formation of a third sacrificial layer 120 over the first sacrificial layer 65 and portion 300D of the double arcuate structure compliant off-chip 300.

FIG. 7H is a schematic that illustrates the formation of portion 300E of the double arcuate structure compliant off-chip 300 after etching a portion of the second sacrificial layer 120. Portion 300E includes the assembly post 45.

FIG. 7I is a schematic that illustrates the removal of the first, second, and third sacrificial layers 55, 65, and 120 and seed layer 50, thereby exposing portions 300A–300E (not shown as separate portions) which form the double arcuate structure compliant off-chip interconnect 300.

FIG. 7J is a schematic that illustrates the connection of the double arcuate structure compliant off-chip interconnect 300 to the pillar 20 on the assembly substrate 18. Subsequently, the double arcuate structure compliant off-chip interconnect 300 can be disconnected from the fabrication substrate 15.

EXAMPLE 5

Figure 8A:
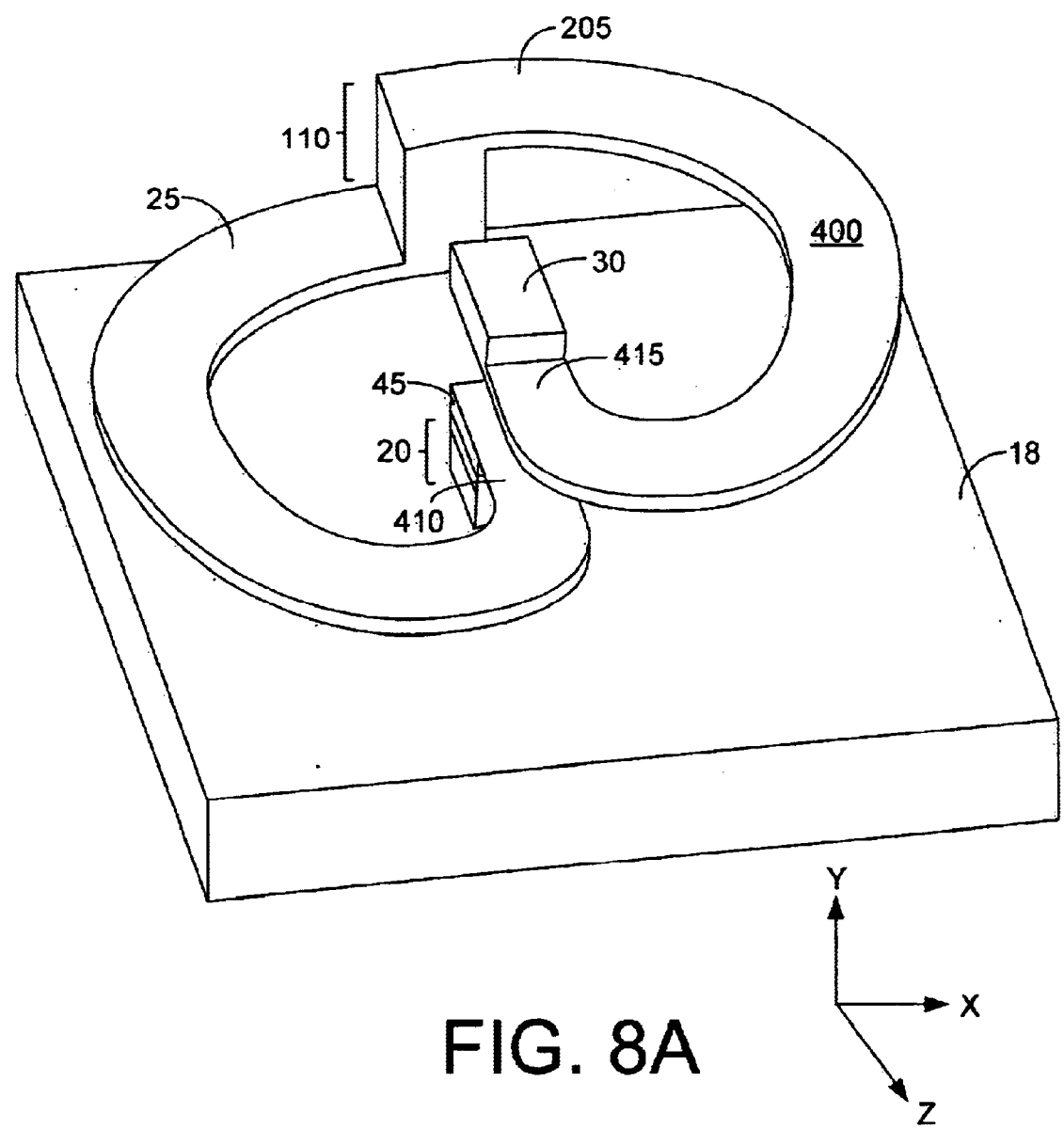
FIG. 8A illustrates a perspective view of another double arcuate structure compliant off-chip interconnect with rounded corners (called "β–fly").
Figure 8B:
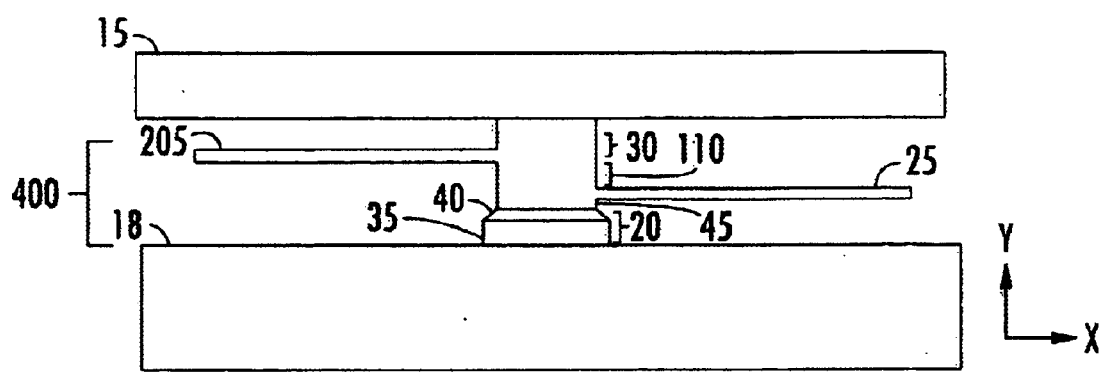
FIG. 8B illustrates a side (xy axis) view of the double arcuate structure compliant off-chip interconnect shown in FIG. 8A.
Figure 8C:
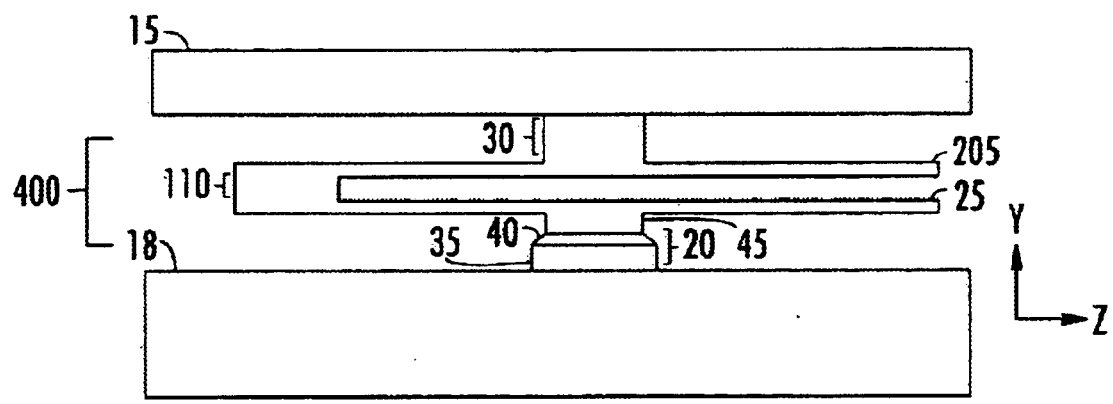
FIG. 8C illustrates a side (zy axis) view of the double arcuate structure compliant off-chip interconnect shown in FIG. 8A.
Figure 8D:
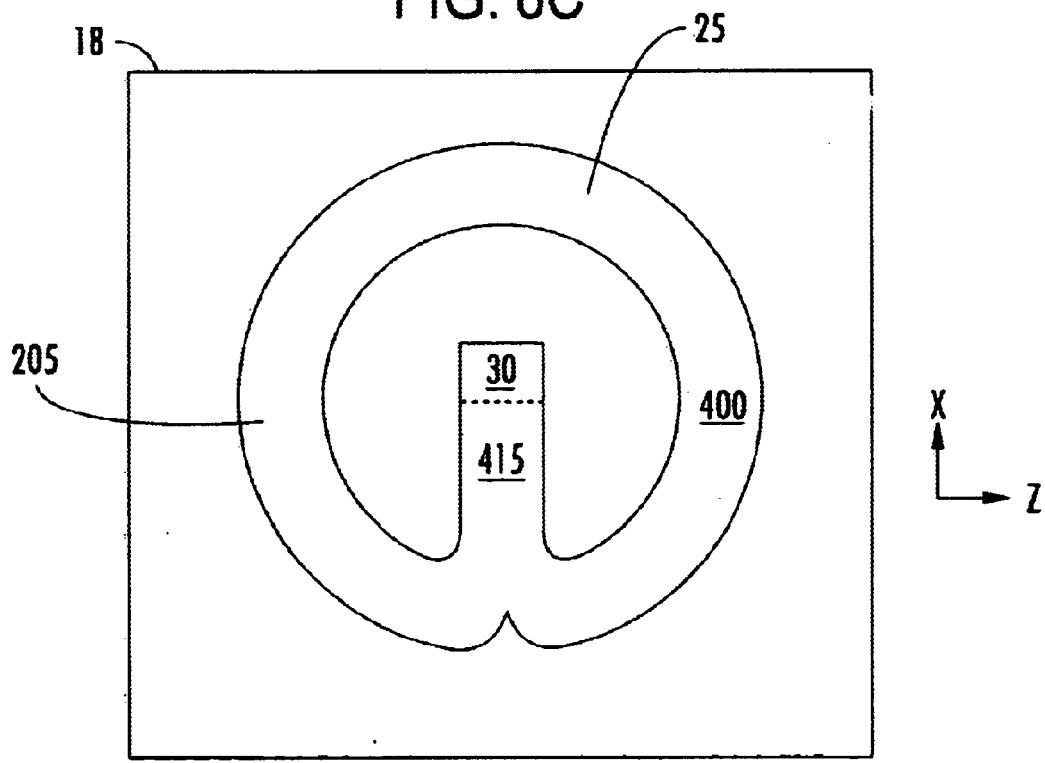
FIG. 8D illustrates a top view of the double arcuate structure compliant off-chip interconnect shown in FIG. 8A.

FIGS. 8A–8D are schematics that illustrate a perspective view, a first side view (xy axis), a second side view (zy axis), and a top view, respectively, of a double arcuate structure compliant off-chip interconnect 400. FIGS. 8A and SD depict the double arcuate structure compliant off-chip interconnect 400 the assembly substrate 18, while FIGS. 8B and 8C depict double arcuate structure compliant off-chip interconnect 400 connected to the fabrication substrate 15. The fabrication substrate 15 has been omitted from FIGS. 8A and 8D for simplicity and clarity and, as will become apparent below, the double arcuate structure compliant off-chip interconnect 400 is fabricated upon the fabrication substrate 15 and subsequently connected to the assembly substrate 18.

The double arcuate structure compliant off-chip interconnect 400 includes the first arcuate (e.g. semi-circular, curved, or semi-helical) structure 25, the pillar 20, the third arcuate structure 205, the fabrication post 30, the middle post 10, and the assembly post 45, as discussed in reference to FIGS. 5A–5D and 6–6D, as well as a first curved bridge 410 and a second curved bridge 415.

The first arcuate structure 25 and the third arcuate structure 205 are substantially parallel to the fabrication substrate 15 and the assembly substrate 18, while also being substantially parallel to one another. The assembly post 45 can be connected with a first portion of the first curved bridge 410, while a second portion of the first curved bridge 410 is connected to the first portion of the first arcuate structure 25. The first arcuate structure 25 is connected with the lower portion of the middle post 110, while the third arcuate structure 205 is connected to the upper portion of the middle post 110. A first portion of the second curved bridge 415 is connected to the third arcuate structure 205, while a second portion of the second curved bridge 415 is connected to the fabrication post 30. The fabrication post 30 is connected to the fabrication substrate 15. The assembly post 45 is connected to the assembly substrate 18 through pillar 20.

Details regarding the first arcuate structure 25, the pillar 20, the third arcuate structure 205, the fabrication post 30, the middle post 110, and the assembly post 45 have been described above with reference to FIGS. 1A–1D, 3A–3D, 5A–5D and 6A–6D. In addition, the double arcuate structure compliant off-chip interconnect 400 can be symmetrical (FIG. 7A–7D) or asymmetrical (not shown).

The first curved bridge 410 and the second curved bridge 415 can be fabricated from metals, such as copper composites, metal composites, etc. The first bridge 410 and the second bridge 415 each can have a thickness of about 3 to about 30 micrometers and a width of about 5 to about 50 micrometers. Preferably, the first curved bridge 410 and the second curved bridge 415 have a thickness of about 10 micrometers and a width of about 20 micrometers.

Generally, the first arcuate structure 25, the third arcuate structure 205, the fabrication post 30, the middle post 110, the assembly post 45, the first curved bridge 410, and the second curved bridge 415 are fabricated from the same arcuate structure material. However, the first arcuate structure 25, the third arcuate structure 205, the fabrication post 30, the middle post 110, the assembly post 45, the first curved bridge 410, and the second curved bridge 415 can be fabricated of one or more materials.

In a manner similar to the fabrication of the asymmetrical double arcuate structure compliant off-chip interconnect 100, the symmetrical double arcuate structure compliant off-chip interconnect 200, the double arcuate structure compliant off-chip interconnect 300 described in FIGS. 3A–3D and 4A–4I, FIGS. 5A–5D, and FIGS. 6A–6D, respectively, the double arcuate structure compliant off-chip interconnect 400 can be fabricated using conventional photolithography based integrated circuit fabrication techniques. In general, after depositing, masking, and etching for each metal layer, the double arcuate structure compliant off-chip interconnect 400 is fabricated through photosensitive sacrificial layers (e.g., polymer). Subsequently, the sacrificial layers can be etched away to form the free-standing double arcuate structure compliant off-chip interconnect 400.

Now referring to a representative fabrication process, FIGS. 9A–9J are schematics of a representative process for fabricating the double arcuate structure compliant off-chip interconnect 400 shown in FIGS. 6A–6D. For simplicity and clarity, some portions of the fabrication process (e.g., depositing, masking, and etching) are not included in FIGS. 9A–9J. For example, seed layers may be used to form portions 400B, 400C, 400D, and 400E in FIGS. 9C, 9E, 9F, and 9H below, but the seed layers are not represented in the those figures.

FIG. 9A is a schematic illustrating first substrate 15 having a seed layer 50 deposited thereon. In addition, the seed layer 50 has a sacrificial layer 55 disposed thereon.

FIG. 9B is a schematic that illustrates the formation of portion 400A of the double arcuate structure compliant off-chip interconnect 400 after a portion of the seed layer 50 and the sacrificial layer 55 have been etched. Portion 400A includes the fabrication post 30.

FIG. 9C is a schematic that illustrates the formation of portion 400B of the double arcuate structure compliant off-chip interconnect 400 onto portion 400A and the sacrificial layer 55 through a portion of a photoresist layer 60. Portion 400B includes the third arcuate structure 205 and the second curved bridge 415.

FIG. 9D is a schematic that illustrates the formation of a second sacrificial layer 65 over the first sacrificial layer 55 and portion 400B of the double arcuate structure compliant off-chip interconnect 400 after the photoresist layer 60 has been removed.

FIG. 9E is a schematic that illustrates the formation of portion 400C of the double arcuate structure compliant off-chip interconnect 400 onto portion 400B after etching a portion of the second sacrificial layer 65. Portion 400C includes the middle post 110.

FIG. 9F is a schematic that illustrates the formation of portion 400D of the double arcuate structure compliant off-chip 400 onto the sacrificial layer 65 through a portion of a photoresist layer 60. Portion 400D includes the first arcuate structure 25 and the first curved bridge 410.

FIG. 9G is a schematic that illustrates the formation of a third sacrificial layer 120 over the first sacrificial layer 65 and portion 400D of the double arcuate structure compliant off-chip 400.

FIG. 9H is a schematic that illustrates the formation of portion 400E of the double arcuate structure compliant off-chip 400 after etching a portion of the second sacrificial layer 120. Portion 400E includes the assembly post 45.

FIG. 9I is a schematic that illustrates the removal of the first, second, and third sacrificial layers 55, 65, and 120 and seed layer 50, thereby exposing portions 40OA–400E (not shown as separate portions) which form the double arcuate structure compliant offchip interconnect 400.

FIG. 9J is a schematic that illustrates the connection of the double arcuate structure compliant off-chip interconnect 400 to the assembly substrate 18. Subsequently, the double arcuate structure compliant off-chip interconnect 400 can be disconnected from the fabrication substrate 15.

It should be emphasized that the above-described embodiments of the present invention are merely possible examples of implementations, merely set forth for a clear understanding of the principles of the invention. Many variations and modifications may be made to the above-described embodiments. All such modifications and variations are intended to be included herein within the scope of this disclosure and protected by the following claims.

What is claimed is:

1. An electronic package comprising:
    a substrate; and
    a free-standing compliant off-chip interconnect disposed on the substrate, wherein the free-standing compliant off-chip interconnect includes a first free-standing arcuate structure that is substantially parallel to the substrate, wherein the first free-standing arcuate structure is curved in the plane substantially parallel to the substrate.

2. The electronic package of claim 1, wherein the first arcuate structure is connected to an assembly post.

3. The electronic package of claim 1, wherein the first arcuate structure has a thickness of about 3 to about 30 micrometers, a width of about 5 to about 50 micrometers, and a mean radius of about 5 to about 100 micrometers.

4. The electronic package of claim 1, wherein the assembly post has a height of about 5 to about 50 micrometers.

5. The electronic package of claim 1, wherein the substrate can be a material chosen from a semiconductor, glass, ceramic, and quartz material.

6. The electronic package of claim 1, wherein the free-standing compliant off-chip interconnect further includes:
    a second free-standing arcuate structure that is substantially parallel to the substrate, and wherein the first arcuate structure and the second arcuate structure are disposed in substantially parallel planes.

7. The electronic package of claim 6, wherein the second arcuate structure is connected to a fabrication post with a second bridge.

8. The electronic package of claim 7, wherein the second bridge includes a curved portion connecting the second arcuate structure to the fabrication post.

9. The electronic package of claim 6, wherein the second arcuate structure has a thickness. of about 3 to about 30 micrometers, a width of about 5 to about 50 and a mean radius of about 5 to about 100 micrometers.

10. The electronic package of claim 6, wherein the first arcuate structure has a first mean radius and the second arcuate structure has a second mean radius, wherein the first mean radius and the second mean radius are not equivalent.

11. The electronic package of claim 6, wherein the first arcuate structure has a first mean radius and the second arcuate structure has a second mean radius, wherein the first mean radius and the second mean radius are equivalent.

12. The electronic package of claim 1, wherein the first arcuate structure is connected to an assembly post with a first bridge.

13. The electronic package or claim 12, wherein the first bridge includes a curved portion connecting the first arcuate structure to the assembly post.

14. A free-standing compliant off-chip interconnected structure, comprising:
    a substrate;
    a first arcuate structure disposed on the substrate, wherein the first arcuate structure is curved in the plane substantially parallel to the substrate;
    a second arcuate structure, wherein the first arcuate structure and the second arcuate structure are disposed in substantially parallel planes, wherein the second arcuate structure is curved in the plane substantially parallel to the substrate; and
    a middle post, wherein the first arcuate structure is connected to a lower portion of the middle post, and wherein the second arcuate structure is connected to a upper portion of the middle post.

15. The compliant off-chip interconnect of claim 14, wherein the first arcuate structure has a first mean radius and the second arcuate structure has a second mean radius, wherein the first mean radius and the second mean radius are not equivalent.

16. The compliant off-chip interconnect of claim 14, wherein the first arcuate structure has a first mean radius and the second arcuate structure has a second mean radius, wherein the first mean radius and the second mean radius are equivalent.

17. The compliant off-chip interconnect of claim 14, wherein the first arcuate structure has a thickness of about 3 to about 30 micrometers, a width of about 5 to about 50 micrometers, and a mean radius of about 5 to about 100 micrometers.

18. The compliant off-chip interconnect of claim 14, wherein the second arcuate structure has a thickness of about 3 to about 30 micrometers, a width of about 5 to about 50 micrometers, and a mean radius of about 5 to about 50 micrometers.

19. The compliant off-chip interconnect of claim 14, wherein the middle post has a height of about 5 to about 50 micrometers.

* * * * *